United States Patent [19]
Steingroever

[11] Patent Number: 5,684,341
[45] Date of Patent: Nov. 4, 1997

[54] ELECTROMAGNETIC GENERATOR FOR FAST CURRENT AND MAGNETIC FIELD PULSES, FOR EXAMPLE, FOR USE IN MAGNETIC METAL WORKING

[75] Inventor: Erich Steingroever, Bonn, Germany

[73] Assignee: Magnet-Physik Dr. Steingroever GmbH, Germany

[21] Appl. No.: 282,738

[22] Filed: Jul. 29, 1994

[51] Int. Cl.[6] ........................................... H03K 3/86
[52] U.S. Cl. ............... 307/16; 307/109; 336/182; 336/223; 333/20; 363/34; 363/35
[58] Field of Search ............... 336/178, 82, 180, 336/182, 195, 223; 307/106, 107, 108, 109, 110; 333/20; 327/177, 181, 182, 183, 190, 268, 300; 363/34, 35

[56] References Cited

U.S. PATENT DOCUMENTS

| | | | |
|---|---|---|---|
| 2,641,682 | 6/1953 | McKenna | 336/223 |
| 2,676,242 | 4/1954 | Witsenburg | 336/223 |
| 3,851,287 | 11/1974 | Miller et al. | 336/183 |
| 3,889,175 | 6/1975 | Isogai et al. | 336/174 |
| 4,263,549 | 4/1981 | Toppeto | 336/223 |
| 4,682,114 | 7/1987 | Aucouturier et al. | 336/182 |
| 5,038,051 | 8/1991 | Firman et al. | 307/106 |
| 5,444,963 | 8/1995 | Steingroever et al. | 53/488 |
| 5,452,506 | 9/1995 | Biedermann et al. | 53/381.4 |
| 5,521,572 | 5/1996 | Goodwin et al. | 336/184 |
| 5,521,811 | 5/1996 | Levran et al. | 363/37 |
| 5,550,523 | 8/1996 | Rouet et al. | 336/195 |

*Primary Examiner*—Richard T. Elms
*Assistant Examiner*—Peter Ganjian
*Attorney, Agent, or Firm*—Harold Gell

[57] ABSTRACT

An electromagnetic generator for working electrically conducting objects with current and magnetic field pulses having a high rate of rise as expressed by dI/dt and dB/dt includes primary windings of a pulse transformer that are arranged in pairs so that their primary currents generate a single current pulse on the secondary side of the pulse transformer. The pulse transformer has as secondary coil comprised of a longitudinally slit pipe on which the insulated primary windings are placed. Contact blocks are attached as current outputs next to the longitudinal slit and in the middle of pipe for the connection of an external low-ohmic peak-current loop which encloses a magnetic field concentrator that is made in one or several parts and that can accept one or several metal work pieces.

20 Claims, 4 Drawing Sheets

5,684,341

ELECTROMAGNETIC GENERATOR FOR FAST CURRENT AND MAGNETIC FIELD PULSES, FOR EXAMPLE, FOR USE IN MAGNETIC METAL WORKING

FIELD OF THE INVENTION

This invention relates to an electromagnetic generator for fast current and magnetic field pulses that is particularly suitable for use in magnet metal working (shape changing).

In this type of use, the important thing is to induce a high current $I_2$ in the object to be influenced, and said current, together with magnet field B of current $I_1$, results in a high force P relating to the length l of the current conductors. When:

$$B = \mu_o \cdot kH \cdot I_1 \text{ and } I_2 = kD \cdot dI_1/dt \cdot 1/R_2$$

Here kH and kD are constants depending on the geometry of the conductors and the metal parts, and $R_2$ is the resistance of the path of the current induced in the metal part, then:

$$P = B \cdot I_2 = I_1 \cdot dI_1/dt$$

A characteristic value for the force generated by a pulse thus is:

$$k = I_1 \cdot dI_1/dt$$

BACKGROUND OF THE INVENTION

It is known that one can generate high current pulses through the discharge of condensers. Their maximum amplitude Imax and rate of rise dI/dt are determined above all by the properties of the available peak current switches.

Very high values are attained with spark gaps as switches. But they are undesirable in operating equipment above all because they wear out.

Ignitrons and thyristors are also available as peak current switches. But ignitrons require much space and therefore cannot be considered in most instances. Besides, they are subject to wear and tear in case of sustained operation.

When thyristors are used as peak current switches, the maximum amplitude Imax and the maximum current rate of rise dI/dt are limited so that one can obtain only limited effects from the pulses during [metal] forming or during the other types of use mentioned.

It has also been proposed (DD 146 403) to arrange several magnetic field coils next to each other simultaneously; these coils are supplied from several condenser discharge units that are separated in terms of potential and that are switched simultaneously. In this case high electrical voltages are used in the condensers to achieve a fast discharge.

The parts to be formed are inserted in the magnetic field coils of such surge current generators.

These known condenser discharge units are dangerous to the operator because of the high voltages that occur in the working area of the magnetic field of the coils and the magnetic field coils require expensive insulation.

OBJECTIVES OF THE INVENTION

The purpose of the invention is to design electromagnetic generators of the kind mentioned initially in a more efficient and safer manner.

A primary objective of the invention is an electromagnetic generator for working electrically conducting objects selected from a group consisting of lids of containers, connecting bushings, and fittings on pipes and hoses, with fast current pulses having a high rate of rise as expressed by dI/dt and magnetic field pulses having a high rate of rise as expressed by dB/dt, for fast current and magnetic field pulses.

Another objective of the invention is the creation of an electromagnetic generator for working electrically conducting objects which includes a plurality of primary windings arranged in pairs of magnetic field coils subdivided into groups, each of which comprises a condenser and electrical current conductors for generating a single current pulse in a secondary winding in response to a plurality of primary current pulses applied simultaneously to different ones of said magnetic field coils.

A further objective is an electromagnetic generator with a secondary winding comprised of an electrically conducting pipe with a longitudinal slit and magnetic field coils of the primary windings positioned on the electrically conducting pipe with an electrical insulating means therebetween.

Another objective is an electromagnetic generator with a secondary winding which includes a plurality of current output connections dividing the secondary winding into two sections, and a peak-current loop connected to the current output connections.

A further objective is an electromagnetic generator including a magnetic field concentrator arranged within a peak-current loop.

A still further objective is an electromagnetic generator including a magnetic field concentrator in the form of a conductive cylinder that is longitudinally slit and in which, by virtue of the skin effect, the magnetic field of a peak-current loop is concentrated into a space with a surface area smaller than that of the peak-current loop.

Another objective of the invention is an electromagnetic generator including a magnetic field concentrator comprised of two parts that are separated by a longitudinal slit that can be varied in width.

A further objective of the invention is an electromagnetic generator with a peak-current loop surrounded by an amplification block made of a material selected from a group comprising iron and non-metallic material for the absorption of radial mechanical forces created by the magnetic field pulses produced by the electromagnetic generator.

Another objective of the invention is an electromagnetic generator with an omega-shaped peak-current loop.

A still further objective of the invention is an electromagnetic generator with a peak-current loop made in an elongated shape which encloses a magnetic field concentrator that includes two metal-working openings that are arranged next to each other with parallel axes.

A further objective of the invention is an electromagnetic generator for working electrically conducting objects which includes a plurality of primary windings arranged in pairs of magnetic field coils subdivided into groups, each of which comprises a condenser and electrical current conductors for generating a single current pulse in a secondary winding in response to a plurality of primary current pulses applied simultaneously to different ones of said magnetic field coils via simultaneously switched peak-current switches for each condenser and electrical current conductor group.

A still further objective of the invention is an electromagnetic generator incorporating thyristors, transistors, or ignitrons as peak-current switches.

SUMMARY OF THE INVENTION

According to the invention, this problem is solved in that the primary windings of a pulse transformer are magnetic field coils that are arranged in pairs and that their primary currents, on the secondary side of the pulse transformer, generate a single current pulse.

In the pulse transformer, the pulses of the individual discharge circuit are thus combined into a single current pulse that contains a multiple of the current intensity and speed of the sum of the individual current pulses without the presence of any such pulse transformer.

A secondary coil, according to the invention, of the pulse transformer has a longitudinally slit pipe made of copper or some other electrically well-conducting material, on which are placed magnetic field coils that are directly insulated from each other and that constitute primary windings. Contact blocks—for example, blocks that are soldered on or screwed on—are arranged in the middle of the pipe next to the longitudinal slit in order to connect an outer low-ohmic peak-current loop.

The connection between the primary coils and the secondary coil of the pulse transformer is increased by a laminated packet, consisting of transformer sheets, that permits a greater flux stroke. By means of a long current pulse in the negative direction, the remaining flow Br in the iron of the transformer sheets can be reversed so that a greater flow stroke (from −Br to Bs, instead of from +Br to Bs in the flux diagram), and thus a higher load on the transformer will become possible.

A copper or aluminum pipe is made as a secondary coil with current outputs in the middle so that two chambers exist for the primary windings that are subdivided in pairs and that the current outputs serve for the connection of a peak-current loop on the secondary side.

In the peak-current loop, one can arrange a magnetic field concentrator that is made in one or several parts and that advantageously consists of a longitudinally slit copper or aluminum cylinder in which, by means of the skin effect, the magnetic field of the peak-current loop is concentrated on a space with a smaller diameter and/or length.

It is furthermore particularly advantageous when the magnetic field concentrator consists of two parts separated by longitudinal slits which, as required, can be moved closer toward each other or further away from each other so that one can also enclose work pieces with a greater diameter at one end for metal working purposes.

BRIEF DESCRIPTION OF THE DRAWINGS

Preferred practical examples of the invention are illustrated in the diagrams and the drawing.

They include the following.

DESCRIPTION OF THE PREFERRED EMBODIMENT

Figure 1:
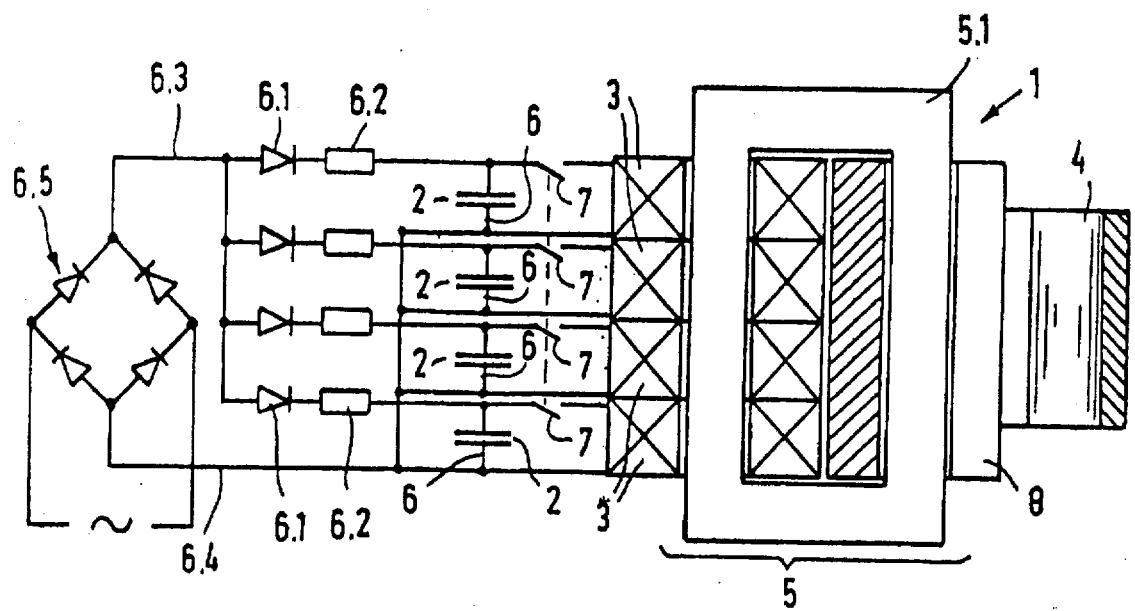
FIG. 1, a schematically perpendicular profile through an electromagnetic generator with pulse transformer and a secondary-side high-current loop connected with it.

The electromagnetic pulse generators 1 that are shown here for fast current and magnetic field pulses can be used especially in magnetic metal working. They consist of several condensers 2 and electrical current conductors that are made as magnetic field coils 3 and that are subdivided, with condensers 2, into several groups that are magnetically series-connected but that are not connected to each other electrically and that, together with the discharge current of condensers 2, in a peak-current loop 4, with a magnetic field concentrator 4.1 (FIGS. 3, 5, and 7), generate a 2-pole or multi-pole magnetic field.

Figure 2:
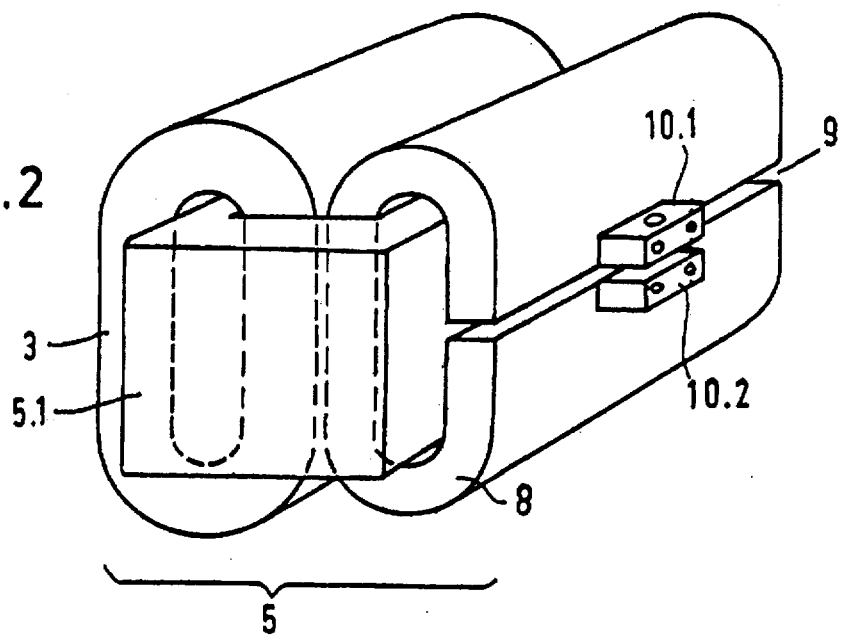
FIG. 2, a perspective view of such a pulse transformer with connections for a peak-current loop.
Figure 3:
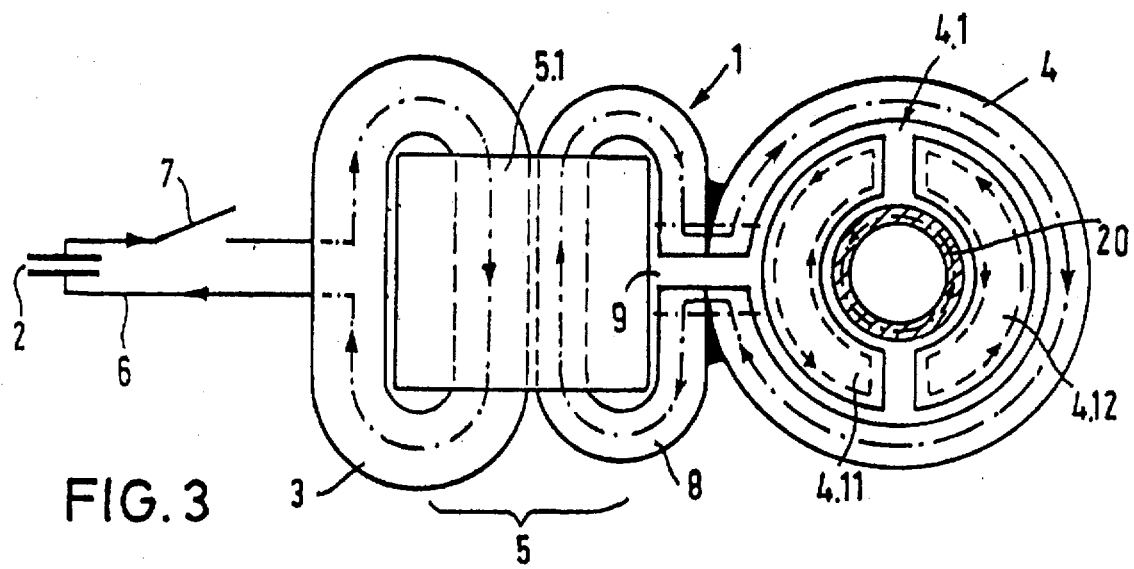
FIG. 3, a pulse transformer with a connected omega-shaped high-current loop and a magnetic field concentrator arranged therein, where the current flux in the primary coil, in the secondary circuit of the transformer, and in the peak-current loop and in the magnetic field concentrator is indicated by means of arrows.

As shown in FIGS. 1 to 3, a pulse transformer 5 is connected between the groups of condensers 2, serving as energy storage units, and the peak-current loop 4; the pulse transformer 5, located on a closed iron core 5.1, made up of a laminated packet of transformer sheets, comprises at least two magnetic field coils 3 that are arranged in pairs and that serve as primary windings.

In the practical example illustrated in FIG. 1, the circuit on the primary side of the pulse transformer 5 is subdivided, for example, into four primary subcircuits 6 that are individually connected with magnetic field coils 3 that form the primary windings of pulse transformer 5. The individual primary subcircuits 6 include diodes 6.1 and charge resistances 6.2, and are connected for power supply to rectifier circuit 6.5 via two common potential lines 6.3, 6.4. They thus have the same potentials. Each primary subcircuit 6 has its own peak-current switch 7 that can be charged to the maximum. The capacitance of each condenser 2 is C/4, the voltage is U. The series-connected four condensers 2 form a capacitance of C/16. They have a voltage 4U so that each peak-current switch 7 has to switch only ¼ of the maximum voltage U max. The maximum current $I_1$ is preserved.

Figure 6:
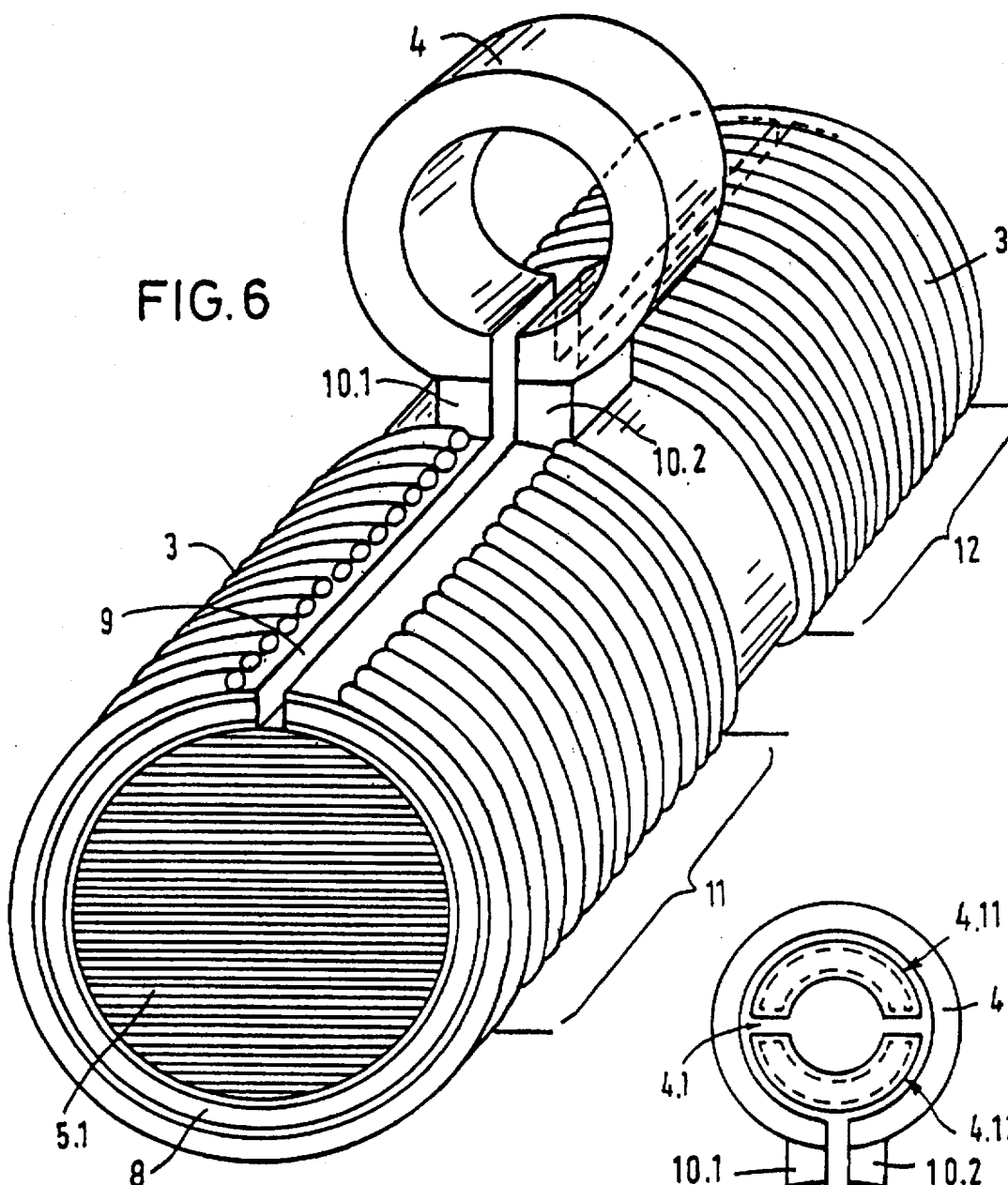
FIG. 6, a perspective view of a copper or aluminum pipe with a longitudinal slit as secondary coil of such a post transformer and with an omega-shaped peak-current loop connected there too.

Pulse transformer 5 has an electrically well-conducting pipe 8, for example, a copper or aluminum pipe, with a longitudinal slit 9 as secondary coil and, on it, insulated magnetic field coils 3 as primary windings that are subdivided at least in pairs (FIG. 6).

Copper or aluminum pipe 8, as shown in the perspective drawing in FIG. 6, is fashioned as a secondary coil, with two contact blocks as current outputs 10.1 and 10.2, in the middle, so that there are two chambers 11, 12 for the primary windings that are subdivided in pairs. The contact blocks for current outputs 10.1, 10.2 can be soldered or screwed on pipe 8 on both sides of longitudinal slit 9 and serve for the connection of a peak-current loop 4 on the secondary side of transformer 5 in which—during the discharge of a primary circuit—there appears a current pulse with a high I·dI/dt that is increased corresponding to the winding ratio between primary circuits and secondary circuits.

The current flux in the various circuits of the primary-side magnetic field coils 3, of the secondary coil, and of the peak-current loop 4, as well as in the magnet field concentrator 4.1, is shown in FIG. 3. The current flux always runs opposite, corresponding to Lenz's rule, in neighboring circuits up to a metal part 20 that is to be worked.

Figure 8:
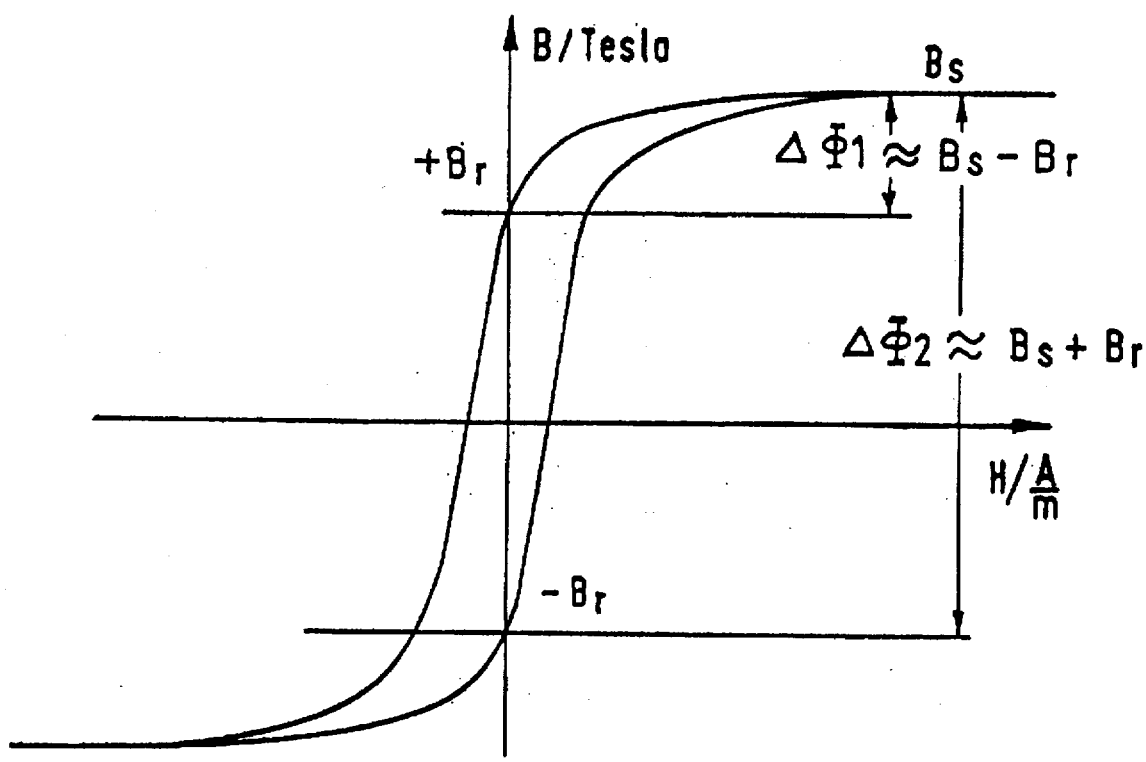
FIG. 8, a diagram of the flux density in the iron core of the pulse transformer with flux stroke $\Delta\Phi_1$ without flux reversal and $\Delta\Phi_2$ with flux reversal.

The connection between the primary and secondary coils or windings of pulse transformer 5—that is to say, between magnetic field coils 3 and slit pipe 8—is increased by the laminated packet of transformer sheets of iron core 5.1 that permits greater flux stroke as shown in the flux diagram in FIG. 8. By means of a long current pulse in a negative direction, one can reverse the remaining flux Br in the iron of the transformer sheets so that a greater flux stroke (from −Br to Bs instead of from +Br to Bs in the flux diagram), and thus a higher load on the pulse transformer will be possible.

The diagram of the flux density on iron core 5.1 of pulse transformer 5 in FIG. 8 shows, on one hand, the flux stroke $\Delta\Phi_1$ without flux reversal and, on the other hand, the flux stroke $\Delta\Phi_2$ with flux reversal. Bs is the flux density in case of saturation of iron core 5.1 whereas +Br and −Br are its remanences.

Using the magnetic field concentrator 4.1 in the peak-current loop 4, one can further increase the flux density B that acts upon metal parts 20 which are to be worked. This concentrator consists of a longitudinally-slit copper or aluminum cylinder in which, by means of the skin effect, the magnetic field of magnetic field coils 3 is concentrated on a space with a smaller diameter and/or length.

Figure 4:
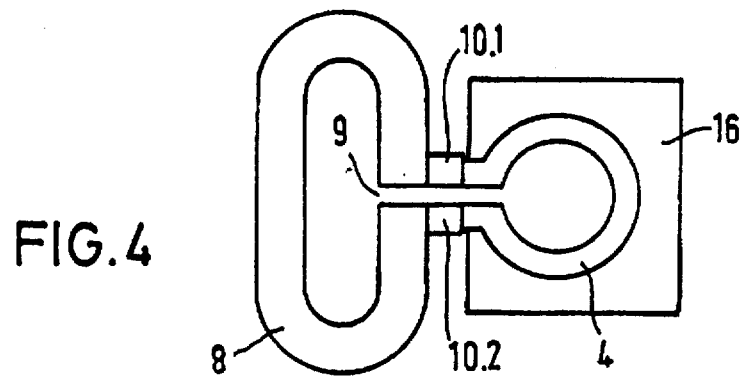
FIG. 4, an illustration of the secondary coil of such a pulse transformer with connected peak-current loop that is surrounded by a mechanically reinforcing block to absorb the radial mechanical forces connected with the magnetic field pulses.

In the practical example in FIG. 4, the magnetic field concentrator of 4.1 is surrounded by a mechanically reinforcing block 16 consisting of iron or a non-magnetic or non-metallic raw material to absorb the radial mechanical forces in connection with the magnetic field pulses. When iron or an iron alloy is used, amplification block 16 also serves as magnetic ground.

Figure 5:
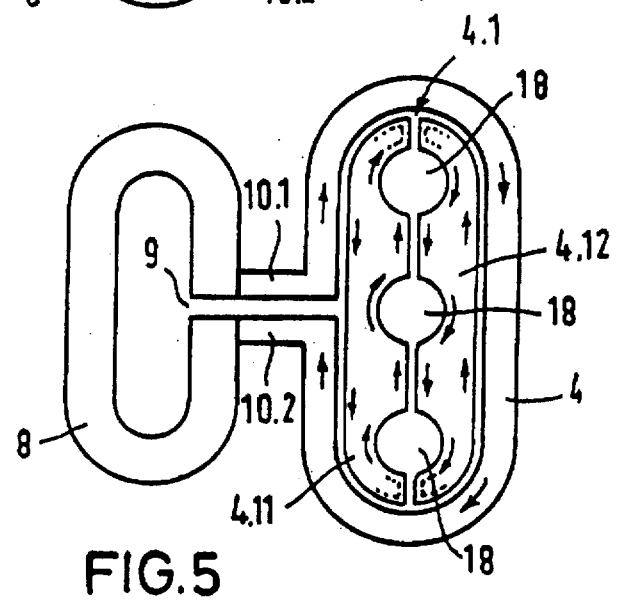
FIG. 5, a secondary coil of a pulse transformer with a longitudinal magnetic field concentrator, arranged in the peak-current loop, with several metal working openings that are arranged next to each other, parallel to the axis.

High-current loop 4 on the secondary side of pulse transformer 5 is made omega-shaped in all of the versions shown and, in the practical example shown in FIG. 5, encloses a magnetic field concentrator 4.1 having a longitudinal oval shape with three metal working openings 18 arranged next to each other parallel to the axis.

Figure 7:
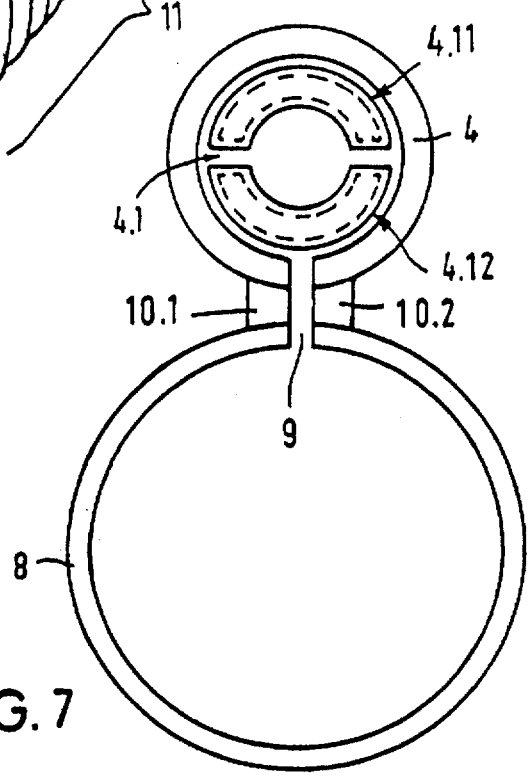
FIG. 7, a front view of the copper or aluminum pipe with mutually insulated lateral connections and peak-current loop.

In the practical examples in FIGS. 3, 5, and 7, magnetic field concentrator 4.1 consists of two parts 4.11 and 4.12 that are separated by longitudinal slits 9 and that can be moved closer to each other or further away from each other as required.

Each group of condensers 2 and primary-side magnetic field coils 3 or primary coils has its own peak-current switch 7. Peak-current switch 7, thyristors, transistors, or ignitrons of the individual groups are switched simultaneously.

Electromagnetic pulse generator 1 can advantageously be used for working electrically conducting objects, such as lids of containers, connecting bushings, or fittings on pipes and hoses; it can also be used for closing container lids according to German patent application P 43 07 708.0.

While preferred embodiments of this invention have been illustrated and described, variations and modifications may be apparent to those skilled in the art. Therefore, we do not wish to be limited thereto and ask that the scope and breadth of this invention be determined from the claims which follow rather than the above description.

What is claimed is:

1. An electromagnetic generator for fast current and magnetic field pulses, comprising:

a pulse transformer including a plurality of primary windings arranged in pairs and a secondary winding;

said primary windings comprising a plurality of magnetic field coils subdivided into groups, each of which comprises a condenser and electrical current conductors;

said secondary winding comprising an electrically conducting pipe with a longitudinal slit that is the functional equivalent of a secondary coil; and said magnetic field coils positioned on said electrically conducting pipe with an electrically insulating means therebetween.

2. An electromagnetic generator according to claim 1, characterized in that said magnetic field coils are positioned on said electrically conducting pipe with electrical insulating means therebetween for generating a single current pulse in said secondary winding in response to a plurality of primary current pulses applied simultaneously to different ones of said magnetic field coils.

3. An electromagnetic generator according to claim 1, characterized in that said secondary winding includes a plurality of current output connections dividing said secondary winding into two sections, and a peak-current loop connected to said plurality of current output connections.

4. An electromagnetic generator according to claim 2, comprising:

current output connections for said electrically conducting pipe positioned in the middle thereof for dividing said electrically conducting pipe into two sections for supporting said primary windings that are subdivided into pairs, and a peak-current loop connected to said current output connections.

5. An electromagnetic generator according to claim 2, characterized in that said electrically conducting pipe is fabricated from a highly conductive material selected from a group including copper and aluminum.

6. An electromagnetic generator according claim 3, comprising:

a magnetic field concentrator arranged within said peak-current loop.

7. An electromagnetic generator according to claim 6, characterized in that said magnetic field concentrator consists of a conductive cylinder that is longitudinally slit and in which, by virtue of the skin effect, the magnetic field of said peak-current loop is concentrated into a space with a surface area smaller than said peak-current loop.

8. An electromagnetic generator according to claim 6, characterized in that said magnetic field concentrator includes two parts that are separated by a longitudinal slit that can be varied in width.

9. An electromagnetic generator according to claim 6, characterized in that said magnetic field concentrator is fabricated from a highly conductive material selected from a group including copper and aluminum.

10. An electromagnetic generator according to claim 6, characterized in that said peak-current loop is surrounded by a reinforcing block made of a material selected from a group comprising iron and non-metallic material for the absorption of radial mechanical forces created by said magnetic field pulses produced by said electromagnetic generator.

11. An electromagnetic generator according to claim 4, characterized in that said peak-current loop is omega-shaped.

12. An electromagnetic generator according to claim 6, characterized in that said peak-current loop is made in an elongated shape and encloses said magnetic field concentrator, and said magnetic field concentrator includes two metal-working openings that are arranged next to each other with parallel axes.

13. An electromagnetic generator as defined in claim 1, comprising a peak-current switch for each of said condenser and electrical current conductor groups.

14. An electromagnetic generator according to claim 13, characterized in that said peak-current switches are switched simultaneously.

15. An electromagnetic generator according to claim 13, characterized in that said peak-current switches are electronic devices selected from a group including thyristors, transistors, and ignitrons.

16. An electromagnetic generator according to claim 1, wherein said fast current pulses have a high rate of rise as expressed by dI/dt and said magnetic field pulses have a high rate of rise as expressed by dB/dt.

17. An electromagnetic generator according to claim 1, wherein said fast current and magnetic field pulses provide a means for shape changing electrically conducting objects.

18. An electromagnetic generator according to claim 17, wherein said electrically conducting objects are selected from a group consisting of lids of containers, connecting bushings, and fittings on pipes and hoses.

19. An apparatus for shape changing electrically conducting objects with current and magnetic field pulses having a high rate of rise as expressed by dI/dt and dB/dt, comprising:

a pulse transformer including a plurality of primary windings arranged in pairs and a secondary winding;

said primary windings comprising a plurality of magnetic field coils subdivided into groups, each of which comprises a condenser and electrical current conductors;

said primary windings positioned on said secondary winding for generating a single current pulse in said secondary winding in response to a plurality of primary current pulses applied simultaneously to different ones of said magnetic field coils;

said secondary winding is an electrically conducting pipe with a longitudinal slit and said magnetic field coils are positioned on said electrically conducting pipe with an electrical insulating means therebetween;

a plurality of current output connections on said electrically conducting pipe dividing said secondary winding into two sections for supporting said primary windings;

a peak-current loop connected to said plurality of current output connections;

a magnetic field concentrator arranged within said peak-current loop;

said magnetic field concentrator comprises a conductive cylinder that is longitudinally slit for concentrating the magnetic field of said peak-current loop into a space with a surface area smaller than said peak-current loop;

said magnetic field concentrator includes two parts that are separated by a longitudinal slit that can be varied in width;

a reinforcing block surrounding said peak-current loop for absorbing radial mechanical forces created by said magnetic field pulses;

a peak-current switch for each of said condenser and electrical current conductor groups; and said peak-current switches are switched simultaneously.

20. An electromagnetic generator for shape changing electrically conducting objects selected from a group consisting of lids of containers, connecting bushings, and fittings on pipes and hoses, with fast current pulses having a high rate of rise as expressed by dI/dt and magnetic field pulses having a high rate of rise as expressed by dB/dt, comprising:

a pulse transformer including a plurality of primary windings arranged in pairs and a secondary winding;

said primary windings comprising a plurality of magnetic field coils subdivided into groups, each of which comprises a condenser and electrical current conductors;

said primary windings positioned on said secondary winding for generating a single current pulse in said secondary winding in response to a plurality of primary current pulses applied simultaneously to different ones of said magnetic field coils;

said secondary winding is an electrically conducting pipe fabricated from a highly conductive material selected from a group including copper and aluminum with a longitudinal slit and said magnetic field coils are positioned on said electrically conducting pipe with an electrical insulating means therebetween;

a plurality of current output connections in the middle of said electrically conducting pipe, dividing said electrically conducting pipe into two sections for supporting said primary windings;

a peak-current loop connected to said plurality of current output connections;

a magnetic field concentrator fabricated from a highly conductive material selected from a group including copper and aluminum arranged within said peak-current loop;

said magnetic field concentrator comprises a conductive cylinder that is longitudinally slit for concentrating the magnetic field of said peak-current loop into a space with a surface area smaller than said peak-current loop;

said magnetic field concentrator includes two parts that are separated by a longitudinal slit that can be varied in width;

said peak-current loop is surrounded by a reinforcing block made of a material selected from a group comprising iron and non-metallic material for the absorption of radial mechanical forces created by said magnetic field pulses produced by said electromagnetic generator;

a peak-current switch selected from a group including thyristors, transistors, and ignitrons for each of said condenser and electrical current conductor groups; and said peak-current switches are switched simultaneously.

* * * * *

UNITED STATES PATENT AND TRADEMARK OFFICE
CERTIFICATE OF CORRECTION

PATENT NO : 5,684,341
DATED : November 4, 1997
INVENTOR(S): Erich Steingroever

It is certified that error appears in the above-identified patent and that said Letters Patent are hereby corrected as shown below:

Foreign Application Priority Data

August 7, 1993        Germany        P 4326548.0

July 7, 1994         Germany        P 4423992.0

Signed and Sealed this

Ninth Day of March, 1999

Attest:

Q. TODD DICKINSON

Attesting Officer     Acting Commissioner of Patents and Trademarks